United States Patent [19]

Ikeuchi et al.

[11] Patent Number: 5,621,315
[45] Date of Patent: Apr. 15, 1997

[54] ANGULAR POSITION DETECTING APPARATUS WITH NOISE DISCRIMINATION

[75] Inventors: Masayuki Ikeuchi; Izuru Shinjo, both of Himeji, Japan

[73] Assignee: Mitsubishi Denki Kabushiki Kaisha, Tokyo, Japan

[21] Appl. No.: 766,293

[22] Filed: Sep. 27, 1991

[30] Foreign Application Priority Data

Oct. 1, 1990 [JP] Japan ................................. 2-260462

[51] Int. Cl.⁶ ............................ G01B 7/00; G01R 33/025
[52] U.S. Cl. .......................................................... 324/207.12
[58] Field of Search ............................... 324/166, 173, 324/174, 207.12, 207.24, 207.16, 207.22

[56] References Cited

U.S. PATENT DOCUMENTS

| | | | |
|---|---|---|---|
| 4,408,159 | 10/1983 | Prox | 324/207.16 |
| 4,694,688 | 9/1987 | Takahashi et al. | |
| 4,835,467 | 5/1989 | Gokhale | 324/174 |

FOREIGN PATENT DOCUMENTS

| | | |
|---|---|---|
| 120919 | 7/1986 | Japan . |
| 175519 | 9/1986 | Japan . |

*Primary Examiner*—W. Snow
*Attorney, Agent, or Firm*—Sughrue, Mion, Zinn, Macpeak & Seas

[57] ABSTRACT

An apparatus for detecting an angular position of a crankshaft of an internal combustion engine includes a disk which is rotatable in synchronism with the rotation of the crankshaft, a row of magnetic elements disposed on the disk along a circumferential periphery thereof at circumferentially equal intervals, an electromagnetic pick-up device disposed orthogonally to a plane of rotation of the disk in opposition to the row of magnetic elements, and a shaping circuit for shaping an output signal of the electromagnetic pick-up device into a rectangular waveform signal. The shaping circuit is combined integrally with the electromagnetic pick-up device into a single unit to prevent external noise from being superposed on the output signal from the pick-up device. The shaping circuit includes an integrator for integrating the output signal to produce a reference signal for the comparator. Additionally, the shaping circuit may include a rectifying/smoothing circuit for rectifying and smoothing the output signal of the pick-up device to produce a level signal, and a high-pass filter circuit having a cut-off frequency which is variable in dependence on a change in the level signal. The output signal of the pick-up device is input to the comparator after having passed through the high-pass filter circuitry so that a pulsating noise component superposed on the pick-up output signal and having a frequency corresponding to the engine rotation speed is satisfactorily eliminated. Thus, accuracy and reliability of the engine control can be remarkably improved.

4 Claims, 7 Drawing Sheets

$f_{O1}, f_{O2}$ : CUT-OFF FREQUENCY

OUTPUT A OF PICK-UP COIL 13

OUTPUT A' OF HIGH-PASS FILTER 50 — $V_{RO}$

OUTPUT B OF SHAPING CIRCUIT 20B

21 COMPARATOR 5,621,315

1

ANGULAR POSITION DETECTING APPARATUS WITH NOISE DISCRIMINATION

BACKGROUND OF THE INVENTION

The present invention relates to an apparatus for detecting an angular position of a crankshaft of an internal combustion engine by using an electromagnetic pick-up device disposed in opposition to :magnetic projections or teeth formed in and along an outer periphery of a rotatable disk. In particular, the invention is concerned with an improvement in the angular position detecting apparatus such that pulsating noise components superposed on the output signal of the electromagnetic pick-up device can be eliminated to thereby assure high reliability and accuracy in the detection of the angular position of the crankshaft and hence in the control of operation of the engine.

In general, an internal combustion engine such as a gasoline engine for a motor vehicle includes a plurality of cylinders in each of which an air fuel mixture is compressed and combusted at an optimal ignition timing. In this conjunction, there has already been proposed and widely used in practical applications a microprocessor-based engine control unit (also known as ECU in abbreviation) for the purpose of optimally controlling the ignition timing of igniters as well as the fuel injection sequence of fuel injectors for the individual engine cylinders.

Further, as a means for detecting the angular position of a crankshaft of the internal combustion engine (hereinafter also referred to simply as the engine) in order to obtain information about the operating positions of the individual cylinders, a variety of apparatuses have been proposed, among which there may be mentioned an angular position detecting apparatus composed of an electromagnetic pick-up device and a disk having an outer periphery formed with magnetic projections or teeth. In this type of angular position detecting apparatus, the electromagnetic pick-up device is usually disposed orthogonally in opposition to a plane of rotation of the disk because of limitation imposed on the space availability for the installation of the apparatus.

For a better understanding of the background of the invention, description will first be made of a known angular position detecting apparatus by reference to FIGS. 8 to 12, in which FIG. 8 is a schematic diagram showing the structure of a known angular position detecting apparatus, FIG. 9 is a plan view showing a geometrical configuration of a disk constituting a part of the apparatus, FIG. 10 is a schematic sectional view showing the structure of an electromagnetic pick-up device constituting another part of the apparatus, and FIGS. 11 and 12 are waveform diagrams for illustrating problems the known angular position detecting apparatus suffers.

Referring first to FIG. 8, a numeral 1 denotes a disk which rotates in synchronism with the crankshaft of an engine (not shown) and has a plurality of magnetic projections or teeth 2 formed in and along a circumferentially peripheral edge of the disk 1 at circumferentiatly equal intervals. In FIG. 9, only some of the teeth are shown. At this juncture, it should be noted that these teeth or projections may be replaced by recesses, dimples or the like while providing substantially the same results so far as they can bring about changes in the magnetic characteristic or the output of the electromagnetic pick-up device.

A reference numeral 10 denotes generally the electromagnetic pick-up device which is disposed orthogonally to the

2 plane of rotation of the disk 1, facing in opposition to the magnetic teeth 2. As will be seen in FIG. 10, the electromagnetic pick-up device includes a core 11 having an outer end projecting toward the row of teeth 2 in a spaced and opposed relation therewith, a bobbin 12 disposed around the core 11, a coil 13 wound on the bobbin 12, a magnet 14 magnetically coupled to the core 11 at the inner end thereof, an electrode or terminal 15 connected to an end of the coil 13, a molded case 18 for fixedly packaging the above-mentioned components 11, 12, 13, 14 and 15 into an integrated structure, and a connector 17 for electrically connecting the electrode 15 to an engine control unit 30 (hereinafter referred to as ECU for short) (see FIG. 8).

In FIG. 8, a lead wire 19 extending from the ECU 30 is connected at one end thereof to the electrode 15 at the connector 17 for taking out an output signal A from the electromagnetic pick-up device 10. The ECU 30 includes a shaping circuit 20 to which the output signal A of the electromagnetic pick-up device 10 is input via the lead wire 19.

The shaping circuit 20 includes a comparator 21 for shaping the output signal A of the pick-up device 10 into a rectangular output signal B, a resistor 22 connected between the lead wire 19 and one input terminal of the comparator 21, and a capacitor 23 connected between the one input terminal of the comparator 21 and ground. The resistor 22 and the capacitor 23 cooperate to constitute a low-pass filter for eliminating external electromagnetic noise which is superposed on the output signal A of the pick-up device 10 on its way to the shaping circuit 20 via the lead wire 19 and which usually contains higher frequency components than that of the output signal A. The other input terminal of the comparator 21 is grounded so as to serve as a reference voltage input terminal.

The ECU 30 includes a processing unit (not shown) for arithmetically determining the angular position of the engine crankshaft on the basis of the rectangular waveform signal B output from the shaping circuit 20. Information about the angular position (crank angle) thus determined is utilized for the control of ignition timing for the engine cylinders and other purposes.

Next, referring to waveform diagrams illustrated in FIGS. 11 and 12, the operation of the known angular position detecting apparatus will be elucidated.

As the disk 1 rotates in synchronism with the crankshaft, the magnetic teeth 2 of the disk 1 successively pass by the outwardly projecting end of the core 11. As a result of this, a pulsating voltage is induced in the coil 13. The induced voltage is output as a signal A and supplied to the shaping circuit 20 of the ECU 30 via the electrode 15 and the lead wire 19.

In this conjunction, it is noted that the impedance of the shaping circuit 20 is selected to be on the order of 100 kΩ in order to ensure a sufficiently high voltage amplitude of the rectangular waveform signal while the impedance of the electromagnetic pick-up device 10 is usually in a range of 500 Ω to 1 kΩ. Consequently, external electromagnetic noise generated upon manipulation or operation of various switches and other electric parts is likely to be superposed on the output signal A on its way to the ECU 30 via the lead wire 19. Under the circumstances, the low-pass filter constituted by the resistor 22 and the capacitor 23 is so designed as to allow only the intrinsic output signal A to pass therethrough. The comparator 21 compares the output signal A having passed through the low-pass filter with the ground potential to thereby generate a rectangular waveform signal B containing a number of pulses corresponding to that of the magnetic teeth 2.

The output signal B from the comparator 21 should desirably exhibit an ideal rectangular waveform which corresponds to the magnetic tooth array 2, as is illustrated in FIG. 11. To this end, the disk 1 should have an ideal flatness and be free of mechanical vibration.

In that case, when the disk 1 is provided with, for example, 180 magnetic teeth 2, then one of the pulses of the rectangular waveform signal B represents an angle or angular increment of 2°. Accordingly, the ECU 30 can discriminatively identify the angular position of the crankshaft (i.e. crank angle) and hence the stroke positions of the individual engine cylinders with a sufficiently high degree of accuracy, which in turn means that the cylinder operation can be optimally controlled with high reliability.

However, in practical applications, the disk 1 is usually deformed or warped more or less and additionally susceptible to vibrations of the engine. As a consequence, the output signal A will inevitably be superposed with a pulsating noise component having a frequency which is proportional to the engine rotation speed or the number of revolution per minute of the engine, as is indicated by a single-dot broken line curve in FIG. 12. Such a pulsating noise component has a frequency lower than that of the intrinsic output signal A. Obviously, the noise level increases as the engine rotational speed or the number of revolutions per minute becomes higher, as in the case of the intrinsic output signal A.

As described previously, the shaping circuit 20 is provided with the low-pass filter composed of the resistor 22 and the capacitor 23, as a result of which the level of the intrinsic output signal A tends to reach saturation as the frequency thereof increases. In contrast, the noise component whose frequency is inherently low can not reach the cut-off frequency of this low-pass filter. For this reason, as the engine rotation speed becomes higher, the level of the noise component increases correspondingly.

It will now be understood from the foregoing that the SN ratio of the output signal A becomes degraded more seriously as the engine rotation number increases, whereby the pulsating noise component tends to be emphasized or become remarkable to such an extent that the duty cycle of the pulse signal B output from the shaping circuit 20 becomes unstable or unsteady. In an extreme case, the pulses may disappear from the signal B, which of course presents a great obstacle to the engine control operation performed by the ECU 30.

SUMMARY OF THE INVENTION

It is therefore an object of the present invention to provide an angular position detecting apparatus which is substantially immune to the shortcomings of the known apparatus described above and in which the low-pass filter can be omitted while ensuring a significantly improved S/N ratio as well as enhanced reliability by positively eliminating the pulsating noise component.

In view of the above and other objects which will become apparent as description proceeds, there is provided, according to a first aspect of the invention, an apparatus for detecting an angular position of a crankshaft of an internal combustion engine, which apparatus comprises a disk rotatable in synchronism with the rotation of the crankshaft, a row of magnetic elements disposed on the disk along a circumferential periphery thereof at circumferentially equal intervals, an electromagnetic pick-up device disposed orthogonally to a plane of rotation of the disk in opposition to the row of magnetic elements, a shaping circuit including a comparator for shaping an output signal of the electromagnetic pick-up device into a rectangular waveform signal, and an engine control unit for discriminatively identifying the angular position of the crankshaft on the basis of the rectangular waveform signal. The shaping circuit is formed integrally width the electromagnetic pick-up device, and it includes an integrator for integrating the output signal of the electromagnetic pick-up device to thereby produce a reference signal for the comparator.

According to another aspect of the invention, there is provided an apparatus for detecting an angular position of a crankshaft of an internal combustion engine, which apparatus comprises a disk being rotatable in synchronism with the rotation of the crankshaft, a row of magnetic elements disposed on the disk along a circumferential periphery thereof at circumferentially equal intervals, an electromagnetic pick-up device disposed orthogonally to a plane of rotation of the disk in opposition to the row of magnetic elements, a shaping circuit including a comparator for shaping an output signal of the electromagnetic pick-up device into a rectangular waveform signal, and an engine control unit for discriminatively identifying the angular position of the crankshaft on the basis of the rectangular waveform signal. The shaping circuit is combined integrally with the electromagnetic pick-up device, and it includes a rectifying/smoothing circuit for rectifying and smoothing the output signal to thereby produce a level signal together with a high-pass filter circuit having a cut-off frequency which is variable in dependence on the level signal. The output signal having passed through the high-pass filter circuit is input to the comparator.

With the apparatus according to the first aspect of the invention, the lead wire and the low-pass filter used in the known apparatus can be omitted. Besides, by using as the reference voltage for the comparator constituting a major part of the shaping circuit an integrated signal which varies in following up the pulsating noise component, it is possible to drastically suppress the influence of the pulsating noise component.

With the apparatus according to the second aspect of the invention, the lead wire and the low-pass filter can be rendered unnecessary. Additionally, it is possible to positively eliminate the pulsating noise component alone by using the high-pass filter having a cut-off frequency which can be controllably adjusted in accordance with the pick-up output signal by taking advantage of the fact that the output signal is in proportion to the engine rotation speed.

The above and other objects, features and advantages of the present invention will be better understood from the following description of exemplary or preferred embodiments thereof taken in conjunction with the accompanying drawings.

DESCRIPTION OF THE PREFERRED EMBODIMENTS

Now, the present invention will be described in detail in conjunction with preferred or exemplary embodiments thereof while referring to the accompanying drawings.

Figure 1:
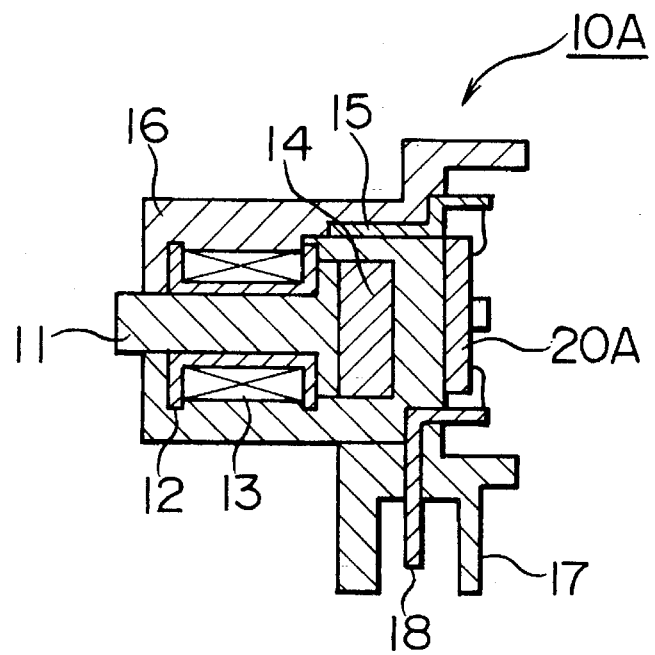
FIG. 1 is a schematic sectional view showing the structure of an angular position detecting apparatus incorporating an electromagnetic pick-up device combined integrally with a shaping circuit according to a first embodiment of the present invention.

FIG. 1 is a schematic sectional view showing an angular position detecting apparatus according to a first embodiment of the invention. In this figure, reference symbols 10A and 20A denote an electromagnetic pick-up device and a shaping circuit which correspond, respectively, to those denoted by 10 and 20 in FIG. 8 and described hereinbefore. Further, components 11 to 17 shown in FIG. 1 are the same as or equivalent to those denoted by like reference numerals in FIG. 8. It should additionally be noted that the disk 1 as well as the magnetic teeth 2 formed along the circumferential periphery of the disk may be the same as those described hereinbefore by reference to FIGS. 8 and 9.

Figure 8:
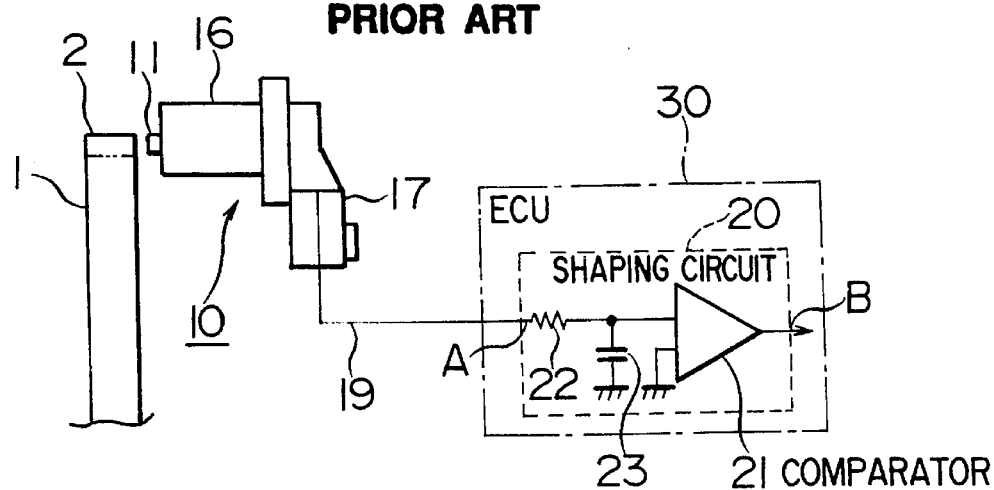
FIG. 8 is a view showing the structure of a known angular position detecting apparatus.
Figure 9:
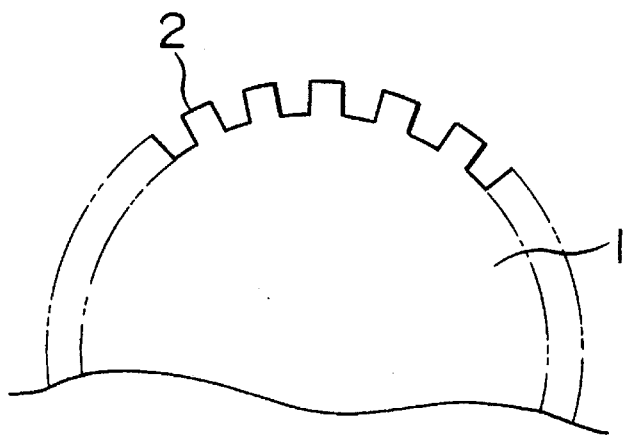
FIG. 9 is a plan view showing a disk constituting a part of the apparatus shown in FIG. 8.
Figure 10:
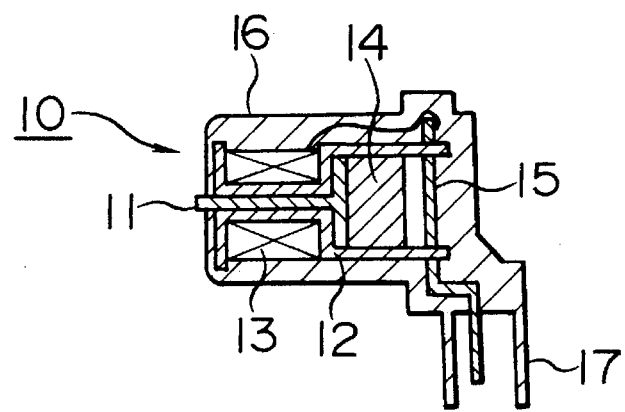
FIG. 10 is a schematic sectional view showing the structure of an electromagnetic pick-up device which constitutes another part of the angular position detecting apparatus shown in FIG. 8.
Figure 11:
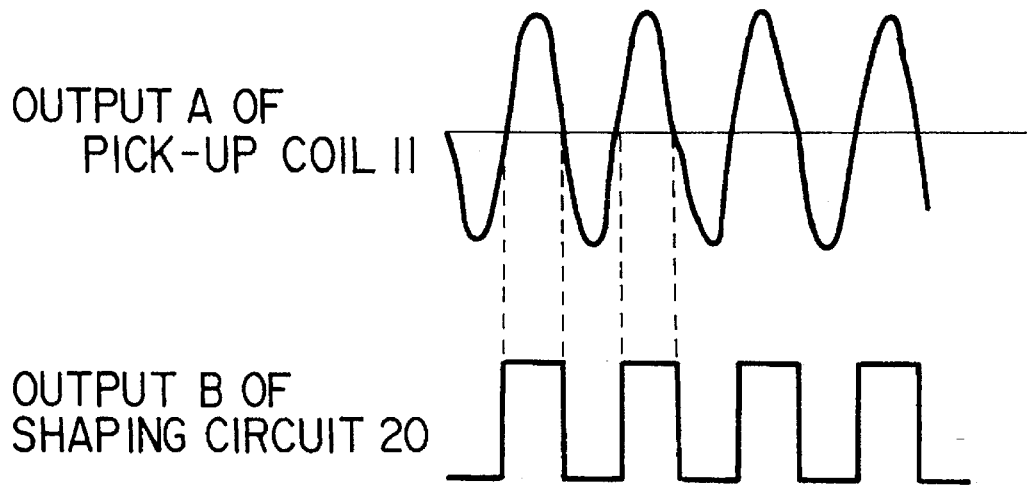
FIG. 11 is a waveform diagram showing an ideal output signal and a rectangular waveform to be obtained in the angular position detecting apparatus.
Figure 12:
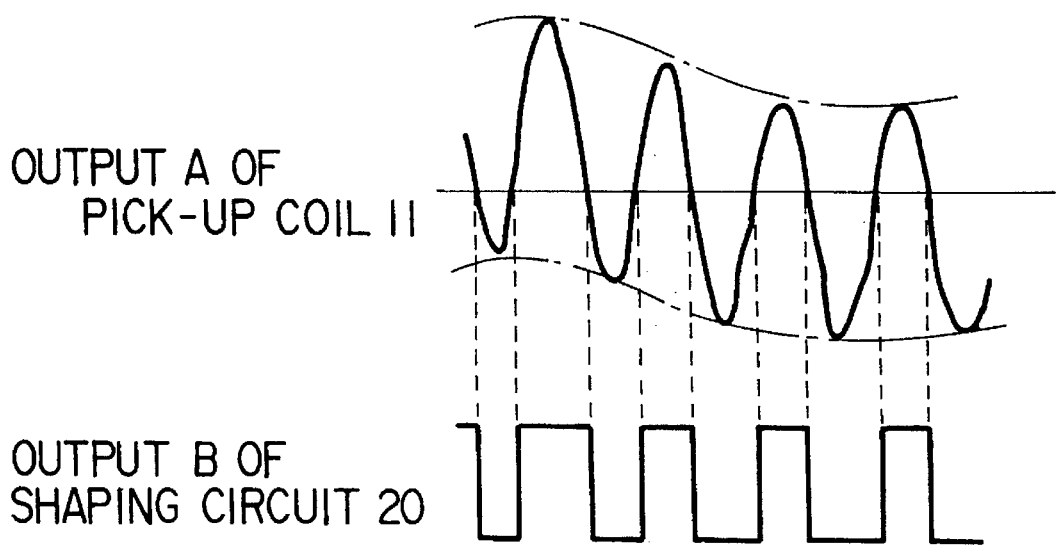
FIG. 12 is a waveform diagram for illustrating the operation of the shaping circuit shown in FIG. 8.

In the case of the angular position detecting apparatus according to the instant embodiment of the invention, the shaping circuit 20A is in the form of a hybrid IC (integrated circuit) and combined integrally with the electromagnetic pick-up device 10A. Accordingly, the lead wire 19 of the pick-up device shown in FIG. 8 is made unnecessary, which in turn means that the possibility of external electromagnetic noise being superposed on the intrinsic signal A produced by the pick-up device 10A can be excluded. Thus, the low-pass filter comprising elements 22, 23 mentioned hereinbefore can be omitted as well.

In FIG. 1, a reference numeral 18 denotes an electrode or terminal through which a rectangular waveform signal produced by the shaping circuit 20A is tapped out to be supplied to an engine control unit or ECU (not shown).

Figure 2:
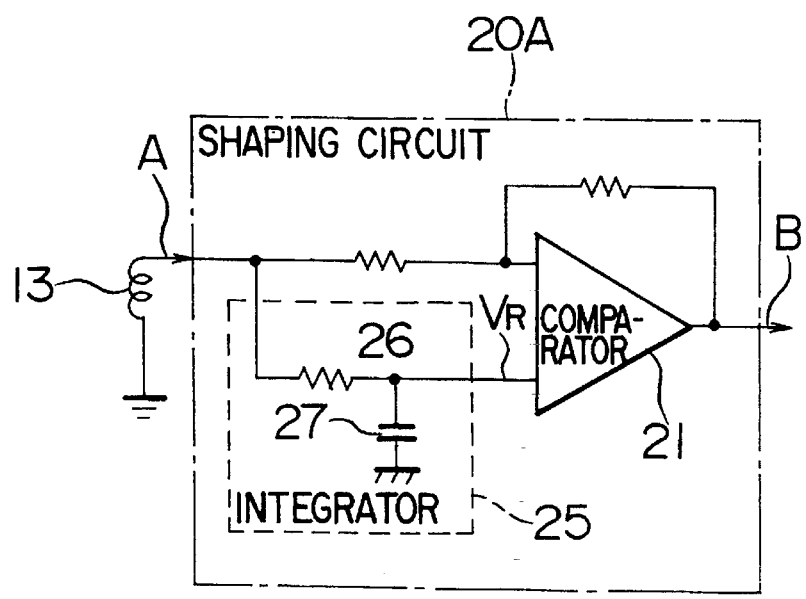
FIG. 2 is a circuit diagram showing details of the shaping circuit incorporated in the apparatus shown in FIG. 1.

FIG. 2 shows a circuit configuration of the shaping circuit 20A. In this figure, a reference numeral. 25 denotes an integrator for integrating the output signal A produced by the pick-up device 10A in the manner described hereinbefore by reference to FIGS. 8 to 12. The output of the integrator 25 is utilized as a reference voltage $V_R$ for a comparator 21. To this end, the integrator 25 includes a resistor 26 connected in series to a reference voltage input terminal of the comparator 21, and a capacitor 27 inserted between the resistor 26 and ground.

Now, the operation of the angular position detecting apparatus according to the instant embodiment will be described by reference to a waveform diagram shown in FIG. 3.

The voltage induced in the coil 13 in the manner described previously is input as the output signal A of the electromagnetic pick-up device 10A to the shaping circuit 20A via the electrode 15.

In this conjunction, it should be noted that because of the integral formation of the shaping circuit 20A and the electromagnetic pick-up device 10A without any interposition of a lead wire therebetween, the chance of external electromagnetic noise being superposed on the output signal A can successfully be excluded. By virtue of this feature, there arises no need to use a low-pass filter as described hereinbefore in conjunction with the known apparatus. This means in turn that the level of the output signal A is prevented from becoming low in a high rotation speed range of the engine, as a result of which an SN ratio is significantly improved, to great advantage.

Figure 3:
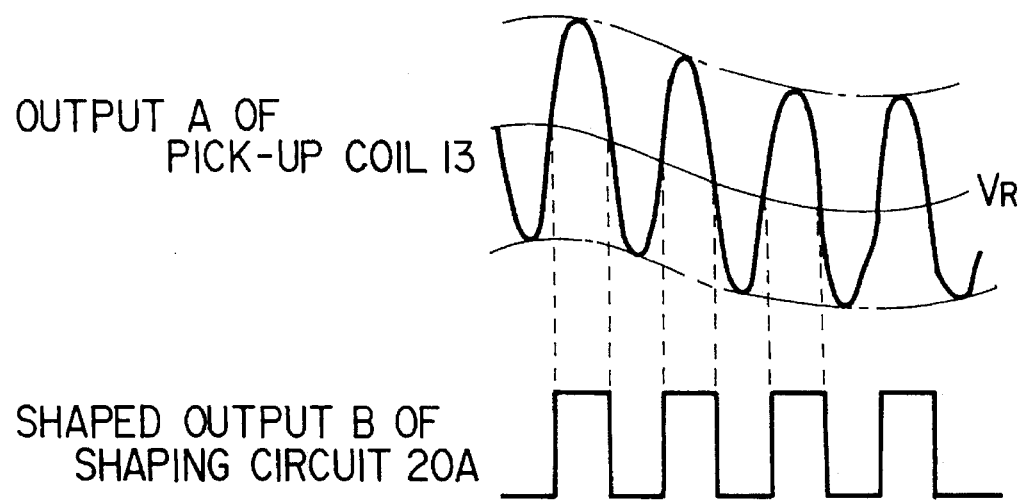
FIG. 3 is a waveform diagram illustrating the operation of the shaping circuit.

The integrator 25 of the shaping circuit 20A integrates the output signal A to thereby produce a reference voltage signal $V_R$ which has a signal level varying in dependence on the frequency of the pulsating noise component mentioned hereinbefore, as is illustrated in FIG. 3. The reference voltage $V_R$ is applied to the reference voltage input terminal of the comparator 21. It will be seen from FIG. 3 that the reference voltage signal $V_R$ corresponds to a medium level of an AC signal resulting from a synthetic combination or mixture of the intrinsic output signal and the pulsating noise component. The comparator 21 compares the output signal A with the reference voltage signal $V_R$ to thereby produce a rectangular waveform signal B which is less affected by the pulsating noise component, as is shown in FIG. 3 at the bottom row. In other words, the signal B has an ideal pulse waveform which can exhibit a well-defined duty cycle.

Parenthetically, the resistance value of the resistor 26 and the electrostatic capacity of the capacitor 27 can be selected in consideration of the frequency of the pulsing noise component to be eliminated as well as the range of rotational speed of the engine to be controlled.

Next, another embodiment of the invention will be described with which it is intended to positively eliminate the pulsating noise component by using a high-pass filter having a variable cut-off frequency.

Figure 4:
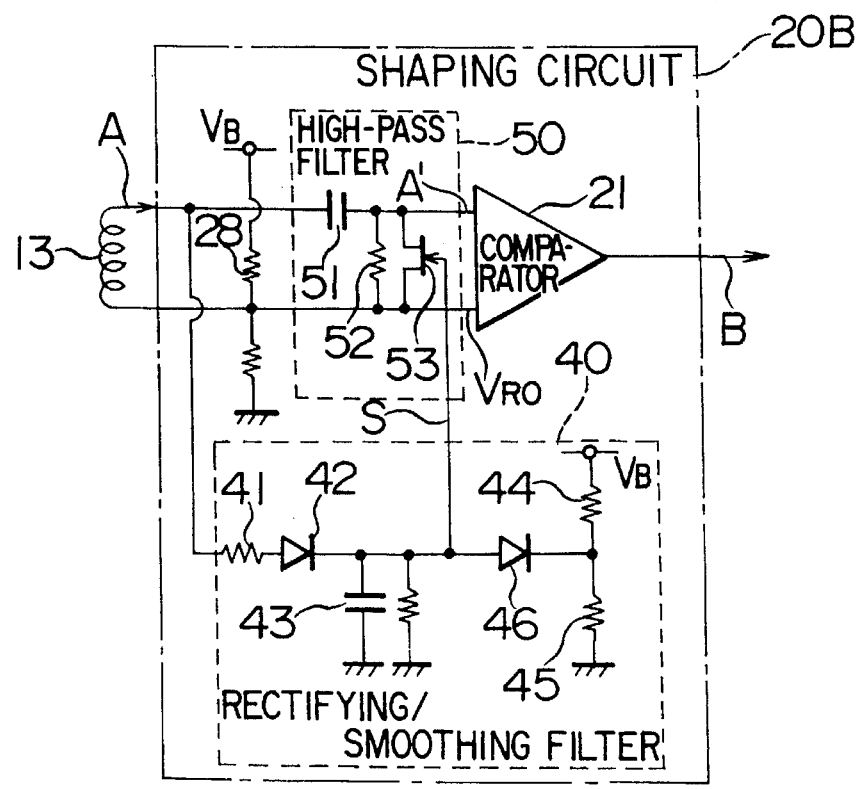
FIG. 4 is a circuit diagram showing a circuit configuration of the shaping circuit according to another embodiment of the invention.

FIG. 4 shows a shaping circuit 20B according to a second embodiment of the invention. Those parts which are omitted from illustration in FIG. 4 are like as those shown in FIG. 1.

In FIG. 4, voltage dividing resistors 28, 29 are connected in series with each other to cooperate to constitute a reference voltage circuit for generating a reference voltage $V_{R0}$ for the comparator 21 by correspondingly dividing a source voltage $V_B$. The junction between the voltage dividing resistors 28 and 29 is connected to the other end of the coil 13 of the electromagnetic pick-up device 10A. A rectifying/smoothing filter circuit 40 serves to rectify and smooth the output signal A of the electromagnetic pick-up device (hereinafter referred to as the pick-up output signal) to generate a level signal S. A high-pass filter circuit. 50 having a variable cut-off frequency $f_0$ is connected between the coil 13 and the input side of the comparator 21 so that the output signal A' of the filter circuit 50 is applied to the input terminals of the comparator 21. The cut-off frequency fo of the high-pass filter circuit 50 varies in dependence on the level signal S.

The rectifying/smoothing filter circuit 40 is constructed as follows. A resistor 41 is connected to the one end of the coil 13 so that it is applied by the output signal A of the coil 13 or the voltage thereacross. A rectifier diode 42 has an anode connected to the resistor 41. A capacitor 43 is connected between the cathode of the diode 42 and ground to constitute, together with the resistor 41, a time constant defining circuit. A pair of voltage dividing resistors 44 and 45 are serially connected with each other between a voltage supply $V_B$ and ground for generating a voltage equivalent to the reference voltage $V_{R0}$. A clamping diode 46 has a cathode connected to the junction between the resistors 44 and 45. The level signal S of the pick-up output signal A from the pick-up coil 13 is tapped out from a junction between the cathode of the rectifier diode 42 and the anode of the clamping diode 46.

Referring to the high-pass filter circuit 50, a capacitor 51 has one end thereof connected to a first output terminal of the comparator 21 and the other end thereof to one end of the pick-up coil 13 whose the other end is connected to a second input terminal of the comparator 21. A resistor 51 is connected at one end thereof to a node between the one end of the capacitor 51 and the first input terminal of the comparator 21, and at the other end thereof to a node between the coil 13 and the second input terminal of the comparator 21 to form, together with the capacitor 51, a time constant defining circuit. An N-type junction field effect transistor 53 (hereinafter referred to as FET for short) is connected in parallel with the resistor 52 between the first and second input terminals of the comparator 21. The FET 53 has a gate to which the level signal S from the rectifying/smoothing filter circuit 40 is applied.

Figure 5:
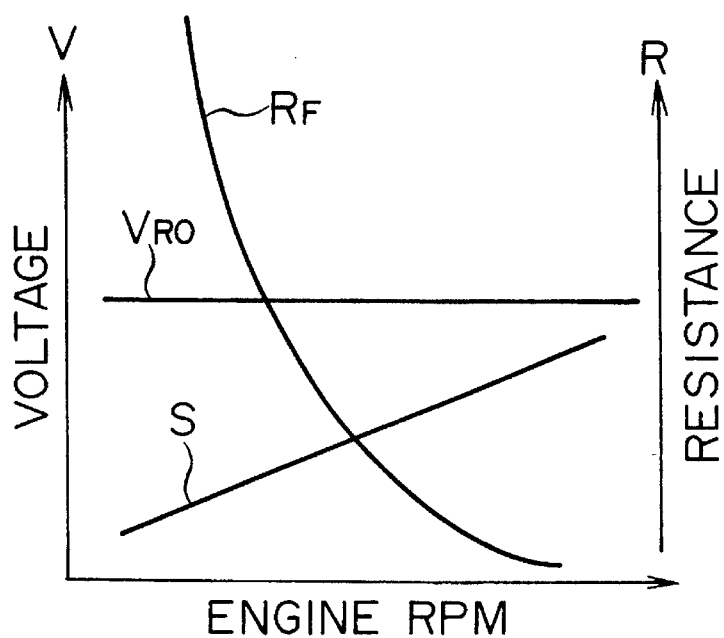
FIG. 5 is a characteristic diagram illustrating the operation of the shaping circuit shown in FIG. 4.

Next, referring to the characteristic diagrams shown in FIGS. 5 and 6 along with the waveform diagram of FIG. 7, description will be made of the operation of the shaping circuit shown in FIG. 4.

At first, a reference voltage $V_{R0}$ across the resistor 29 to be applied to the second input terminal of the comparator 21 is determined or set by appropriately selecting the resistance values of the voltage dividing resistors 28 and 29. This reference voltage $V_{R0}$ is also applied to the FET 53 as a drain voltage to thereby determine the operational characteristic of the FET 53 through cooperation with the level signal S which is applied to the gate of the FET 53. Consequently, the reference voltage $V_{R0}$ is set to an optimum voltage in accordance with a frequency $f_N$ of the pulsating noise component, a frequency $f_A$ of the pick-up output signal A from the coil 13 and the speed range of the engine to be controlled.

Since the FET 53 operates with a negative gate voltage relative to the drain voltage, it is necessary to prevent the level signal S from exceeding the reference voltage $V_{R0}$. To this end, a clamp voltage representing an upper limit of the level signal S is set for the reference voltage $V_{R0}$ by appropriately selecting the resistance values of the resistors 44 and 45 of the rectifying/smoothing filter circuit 40.

In general, the voltage level of the pick-up output voltage A represented by the level signal S is in proportion to the engine rotational speed or the number of revolutions per minute of the engine. Thus, when the engine rotational speed is "0" (zero), the level signal S also assumes a value of "0", resulting in that the FET 53 exhibits a maximum resistance value $R_F$.

As the engine rotational speed increases, the level signal S becomes high. As a consequence, the gate voltage of the FET 53 (having negative polarity relative to the drain voltage $V_{R0}$) increase, which results in a decrease in the difference between the gate voltage and the drain voltage, thus lowering the resistance value $R_F$ presented by the FET 53.

In this conjunction, the cut-off frequency fo of the high-pass filter circuit 50 is given by the following equation:

$$f_0 = \tfrac{1}{2}\pi CR$$

where CR is the impedance of the time constant defining circuit comprising the capacitor 51 and the resistor 52. From this equation, it is apparent: that the cut-off frequency fo becomes higher, as the impedance CR of the time constant defining circuit becomes lower. Accordingly, when the resistance $R_F$ of the FET 53 decreases as the engine rotational speed increases, the combined resistance of the resistor 52 and the FET 53 connected in parallel therewith accordingly decreases, thereby increasing the cut-off frequency fo.

On the other hand, it is noted that when the engine rotation speed increases, not only the level signal S but also the frequency of the intrinsic output signal A and the frequency of the pulsating noise component increase.

Figure 6:
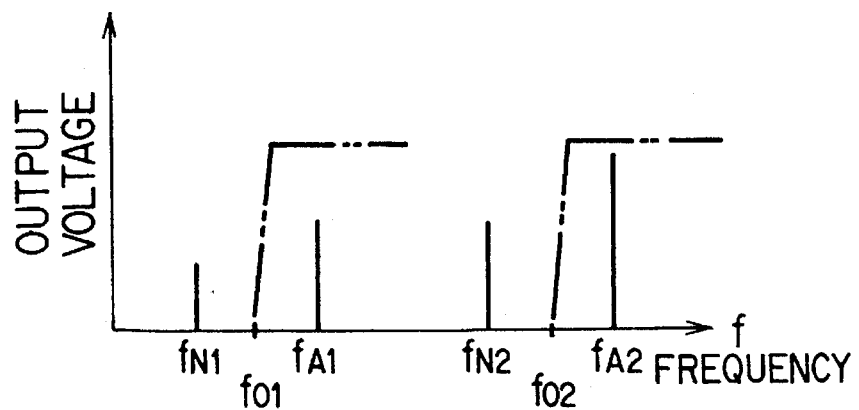
FIG. 6 is a view illustrating a frequency characteristic of the shaping circuit shown FIG. 4.

FIG. 6 graphically illustrates a change in the frequency of the pick-up output signal A as a function of the number of revolutions per minute of the engine. In this figure, $f_{N1}$ and $f_{A1}$ represent the frequency of the pulsating noise component and the frequency of the intrinsic or pick-up output signal A, respectively, in a low engine rpm range, while $f_{N2}$ and $f_{A2}$ represent the frequencies of the pulsating noise component and the output signal, respectively, in a high engine rpm range. Further, $f_{01}$ and $f_{02}$ represent cut-off frequencies of the high-pass filter 50 at the low and high engine rpm ranges, respectively.

Such being the circumstances, it is possible to obtain the cut-off frequency fo which conforms to the output signal A by optimally setting the time constant of the high-pass filter 50 by taking into account the fact that the level of the output signal A varies as a proportional function of the engine rotation speed. Thus, it is possible to eliminate only the pulsating noise component in spite of variations in the frequency of the output signal A (refer to double-dot curves shown in FIG. 6).

Figure 7:
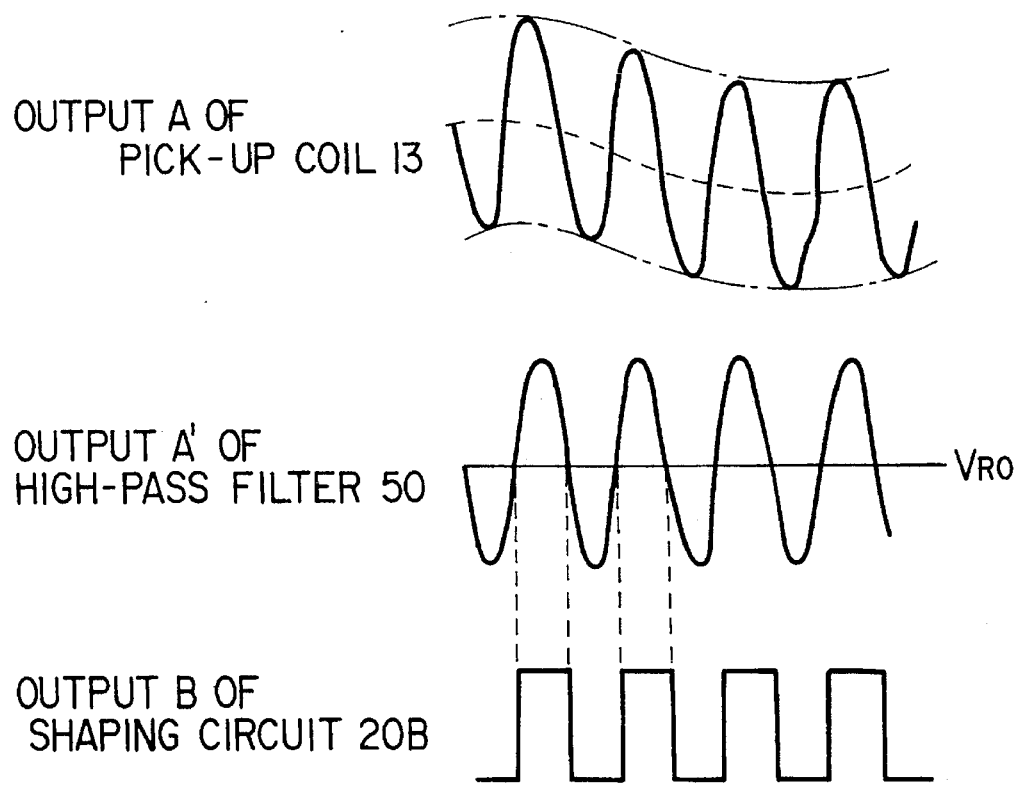
FIG. 7 is a waveform diagram illustrating the operation of the shaping circuit shown in FIG. 4.

As will now be appreciated from the foregoing, the output signal A' of the high pass filter circuit 50 can assume such an ideal waveform as illustrated in FIG. 7, allowing the comparator 21 to output a rectangular waveform signal B which can have an accurate or consistent pulse duty cycle.

It should further be noted that since the shaping circuit 20B is implemented integrally with the electromagnetic pick-up device 10A (see FIG. 1), the low-pass filter employed in the known apparatus can be omitted, whereby the level of the output signal A is protected from becoming lower in the high rotational speed range of the engine.

Figure 4A:
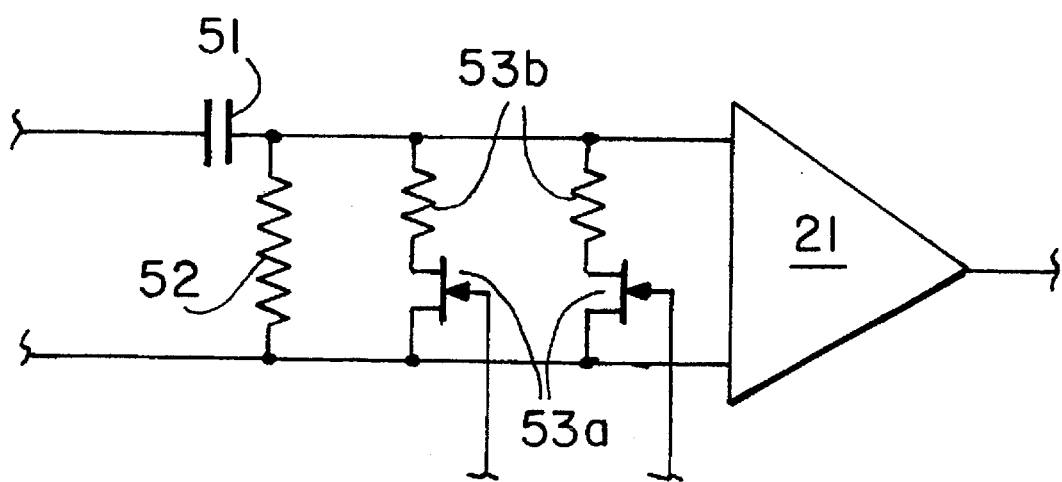
FIG. 4(a) is a circuit diagram of a portion of FIG. 4, showing an alternative high-pass filter.

In the foregoing description, it has been assumed that the high-pass filter 50 having the variable cut-off frequency is constituted by the N-type junction FET 53 with the level signal S being applied to the gate electrode thereof. It should, however, be understood that the high-pass filter 50 may equally be implemented in other configurations so far as the condition that the cut-off frequency fo of the high-pass filter 50 changes in dependence on the engine rotation speed can be satisfied. By way of example, a plurality of discrete ohmic resistors 53b may be connected in parallel with the resistor 52, wherein a switch 53a is connected in series or in parallel to each of the discrete parallel resistors, as shown in FIG. 4(a). By closing these switches sequentially as a function of an increase in the engine rotation speed and hence the level signal S, it is possible to attain substantially the same advantageous effects as obtained with the high-pass filter including the N-type junction FET.

Many features and advantages of the present invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described. Accordingly, all suitable modifications and equivalents may be resorted to, falling within the scope of the invention.

What is claimed is:

1. An apparatus for detecting an angular position of a crankshaft of an internal combustion engine, comprising:
   a) a disk (1) rotatable in synchronism with the rotation of said crankshaft;
   b) a row of magnetic elements (2) disposed on said disk along a periphery thereof at circumferentially equal intervals;
   c) an electromagnetic pick-up device (10A) disposed orthogonally to a plane of rotation of said disk in opposition to said row of magnetic elements;
   d) a shaping circuit (20A) including a comparator (21) for shaping an output signal of said electromagnetic pick-up device into a rectangular waveform signal;
   e) an engine control unit (30) for discriminatively identifying the angular position of said crankshaft on the basis of said rectangular waveform signal; and
   f) means for preventing high frequency and low frequency noise components from adversely affecting the regularity of the rectangular waveform signal, said preventing means comprising:
   1) forming said shaping circuit integrally with said electromagnetic pick-up device to thereby eliminate an elongate lead wire connection between the pick-up device and the shaping circuit, and attendantly avoid the inducement of high frequency noise components by such lead wire, and
   2) an integrator for integrating said output signal of said electromagnetic pick-up device to thereby provide a reference signal for said comparator that tracks low frequency noise components due to deformations of the disk or vibrations thereof.

2. An apparatus for detecting an angular position of a crankshaft of an internal combustion engine, comprising;
   a disk rotatable in synchronism with rotation of the crankshaft;
   a row of magnetic elements disposed on said disk along a periphery thereof at circumferentially equal intervals;
   an electromagnetic pick-up device disposed orthogonally to a plane of rotation of said disk in opposition to said row of magnetic elements;
   a shaping circuit including a comparator for shaping an output signal of said electromagnetic pick-up device into a rectangular waveform signal; and
   an engine control unit for discriminatively identifying the angular position of said crankshaft on the basis of said rectangular waveform signal;
   wherein said shaping circuit is formed integrally with said electromagnetic pick-up device and includes rectifying/smoothing means for rectifying and smoothing said output signal of said magnetic pick-up device to thereby produce a level signal, and high-pass filter means having a cut-off frequency which is variable in dependence on said level signal, said output signal of said electromagnetic pick-up device being input to said comparator after having been passed through said high-pass filter means.

3. An angular position detecting apparatus according to claim 2, wherein said high-pass filter means includes an N-type junction FET connected in parallel with said comparator at the input side thereof, said FET having a gate electrode to which said level signal is applied and a drain electrode to which said output signal of said electromagnetic pick-up device is applied through a capacitor, said drain electrode being connected to one input of said comparator which has the other input thereof supplied with a reference voltage.

4. An angular position detecting apparatus according to claim 2, wherein said high-pass filter means includes a plurality of ohmic resistors connected in parallel to one another and in parallel to said comparator at the input side thereof, said ohmic resistors being provided with switches, respectively, such that said resistors are selectively connected to said comparator in dependence on a change in said level signal by correspondingly turning on and off said switches.

* * * * *